(12) United States Patent
Caughran et al.

(10) Patent No.: US 6,211,621 B1
(45) Date of Patent: Apr. 3, 2001

(54) ENERGY TRANSFER MICROWAVE PLASMA SOURCE

(75) Inventors: James W. Caughran, Lodi, CA (US); Terry L. White, Knoxville, TN (US); Daniel G. Nagal, San Jose; Sidney Hung Luu, Milpitas, both of CA (US)

(73) Assignee: GaSonics International, San Jose, CA (US)

( * ) Notice: Subject to any disclaimer, the term of this patent is extended or adjusted under 35 U.S.C. 154(b) by 0 days.

(21) Appl. No.: 09/272,689

(22) Filed: Mar. 18, 1999

(51) Int. Cl.[7] .............................. H01J 7/24; H05B 31/26
(52) U.S. Cl. .............. 315/111.21; 156/345; 315/111.71; 118/723 MW; 118/723 I
(58) Field of Search ........................ 315/111.21, 111.41, 315/111.51, 111.71; 156/345; 118/723 MW, 723 I

(56) References Cited

U.S. PATENT DOCUMENTS 3,814,983 * 6/1974 Weissfloch ...................... 315/111.21
6,057,645 * 5/2000 Srivastava ...................... 315/111.21

* cited by examiner

*Primary Examiner*—Michael B Shingleton
(74) *Attorney, Agent, or Firm*—Townsend and Townsend and Crew LLP

(57) ABSTRACT

A microwave energy plasma source comprises a cylinder with a top lid that allows a centrally located plasma tube to be supplied with a process gas. On opposite sides of the cylinder walls are located a pair of push-pull air fans that provide a cooling air flow through the inside chamber of the cylinder. Orthogonal to the pair of fans, a microwave energy applicator is mounted to the cylinder walls and has a ring type slow wave structure which surrounds the plasma tube. The bottoms of the cylinder and the plasma tube are connected through a coupler to a process chamber in which is situated a semiconductor wafer being processed. In alternative embodiments, the cylinder has included a movable planar floor and ceiling between which is formed a tunable microwave cavity. Such top and bottom tuning plates are adjusted such that the microwave source impedance is optimally matched to the microwave applicator terminating impedance by affecting the tuned frequency of the ring type slow wave structure.

6 Claims, 3 Drawing Sheets

ENERGY TRANSFER MICROWAVE PLASMA SOURCE

BACKGROUND OF THE INVENTION

1. Field of the Invention

Figure 1:
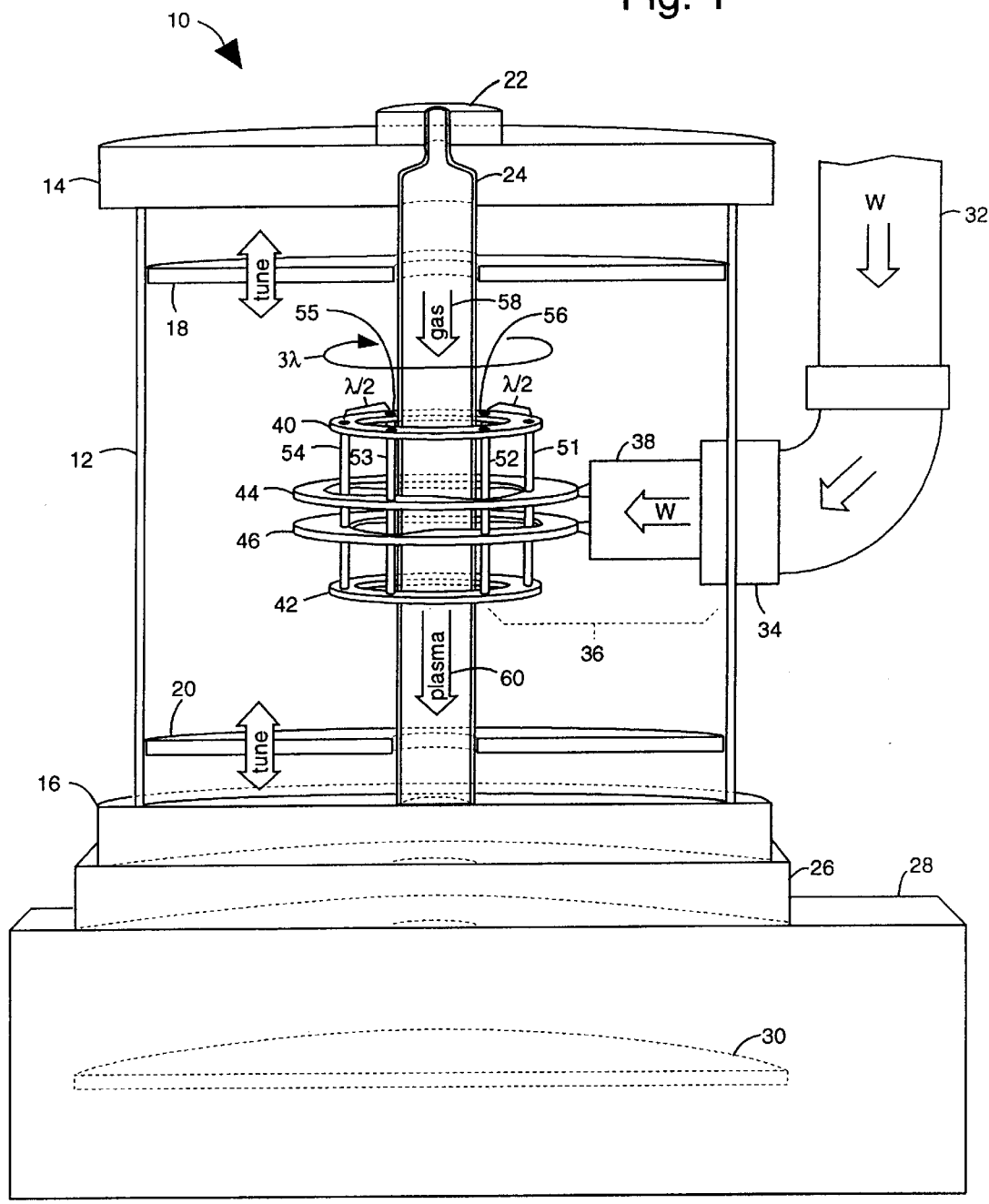

The present invention relates generally to semiconductor processing equipment and more particularly to plasma sources that can be operated at high powers for increased processing rates.

2. Description of the Prior Art

Microwave energy is conventionally coupled to gas flows to generate plasmas useful in semiconductor wafer processing. Prior art equipment couple as much as 1200 watts of microwave energy centered at 2.45 GHz from a ringed "applicator" through and into a quartz plasma tube that passes through the rings.

Carl F. Weissfloch, et al., describe one such applicator in U.S. Pat. No. 3,814,983, issued Jun. 4, 1974, and state that the use of microwave plasmas has been severely limited by the small size of plasma volumes achievable with conventional microwave applicators, namely antennas, waveguides, and cavity resonators. So a slow wave structure illustrated in FIGS. 6–8 of such patent is offered. A thirty-six inch long semi-radiant slow wave applicator is described that operates in the degenerate half wavelength ($\lambda/2$) mode. Slow wave structures such as microwave applicator are supposedly dividable into two types, resonant slow wave structures and traveling slow wave structures. A rectangular waveguide 2 transitions to the slow waveguide structure with a doubly tapered inner conductor 24 that connects to a tapered parallel plane transmission line 25. A set of twelve parallel bars 26, 31 are arranged in a fence-line in FIG. 6 and in a circle in FIGS. 7 and 8. Each bar 26, 31 terminates in a top shorting plane 29, 34 and at the opposite ends in a bottom shorting plane 29, 34. Some prior art equipment uses fourteen such bars in a circle. A central hole in each of the ring shorting planes 34 allows for the insertion of a plasma tube in which the microwave energy is delivered. In between the planes 29, 34, the odd numbered bars 26, 31 connect together with a strap 27, 32 and the even numbered bars 26, 31 connect together with a strap 28, 33. The transmission line 25 is connected to each of the straps 27, 32 and 28, 33 and enters perpendicular to the bars 26, 31.

In practice, such prior art structures have not worked very well. The power delivery is usually very uneven and what energy is delivered concentrates near the first three sets of bars 31 closest to the feed in circular structures. The power delivered by the microwave system is usually limited to 1200 watts because spot heating of the quartz, sapphire or ceramic plasma tubes is too severe to be handled adequately by a cooling system. The terminating impedance presented to the waveguide and microwave source has not been good, and much of the power input is reflected back. The relatively close physical spacing of adjacent bars 26 and 31 on opposite phases carried by the straps 27, 28, 31 and 32 tend to arc together and pitting results.

SUMMARY OF THE PRESENT INVENTION

It is therefore an object of the present invention to provide a microwave energy plasma source that can increase semiconductor process production rates.

It is another object of the present invention to provide a higher power microwave energy plasma source than is conventionally possible.

It is a further object of the present invention to provide a microwave energy plasma source that produces a more uniform plasma.

It is another object of the present invention to provide a microwave energy plasma source that provides an efficient terminating impedance.

Briefly, a microwave energy plasma source embodiment of the present invention comprises a cylinder with a top lid that allows a centrally located plasma tube to be supplied with a process gas. On opposite sides of the cylinder walls are located a pair of push-pull air fans that provide a cooling air flow through the inside chamber of the cylinder. Orthogonal to the pair of fans, a microwave energy applicator is mounted to the cylinder walls and has a ring type slow wave structure which surrounds the plasma tube. The bottoms of the cylinder and the plasma tube are connected through a coupler to a process chamber in which is situated a semiconductor wafer being processed. In alternative embodiments, the cylinder has included a movable planar floor and ceiling between which is formed a tunable microwave cavity. Such top and bottom tuning plates are adjusted such that the microwave source impedance is optimally matched to the microwave applicator terminating impedance by affecting the tuned frequency of the ring type slow wave structure.

An advantage of the present invention is a microwave energy plasma source is provided that can increase semiconductor wafer processing production rates.

Another advantage of the present invention is that a microwave energy plasma source is provided that can be operated at two to three times the plasma power levels of conventional equipment.

A further advantage of the present invention is that a microwave energy plasma source is provided that produces a more uniform plasma density within the plasma tube.

Another advantage of the present invention is that a microwave energy plasma source is provided that provides a better terminating impedance to connecting waveguides and microwave sources.

These and other objects and advantages of the present invention will no doubt become obvious to those of ordinary skill in the art after having read the following detailed description of the preferred embodiment which is illustrated in the drawing figures.

IN THE DRAWINGS

Figure 2:
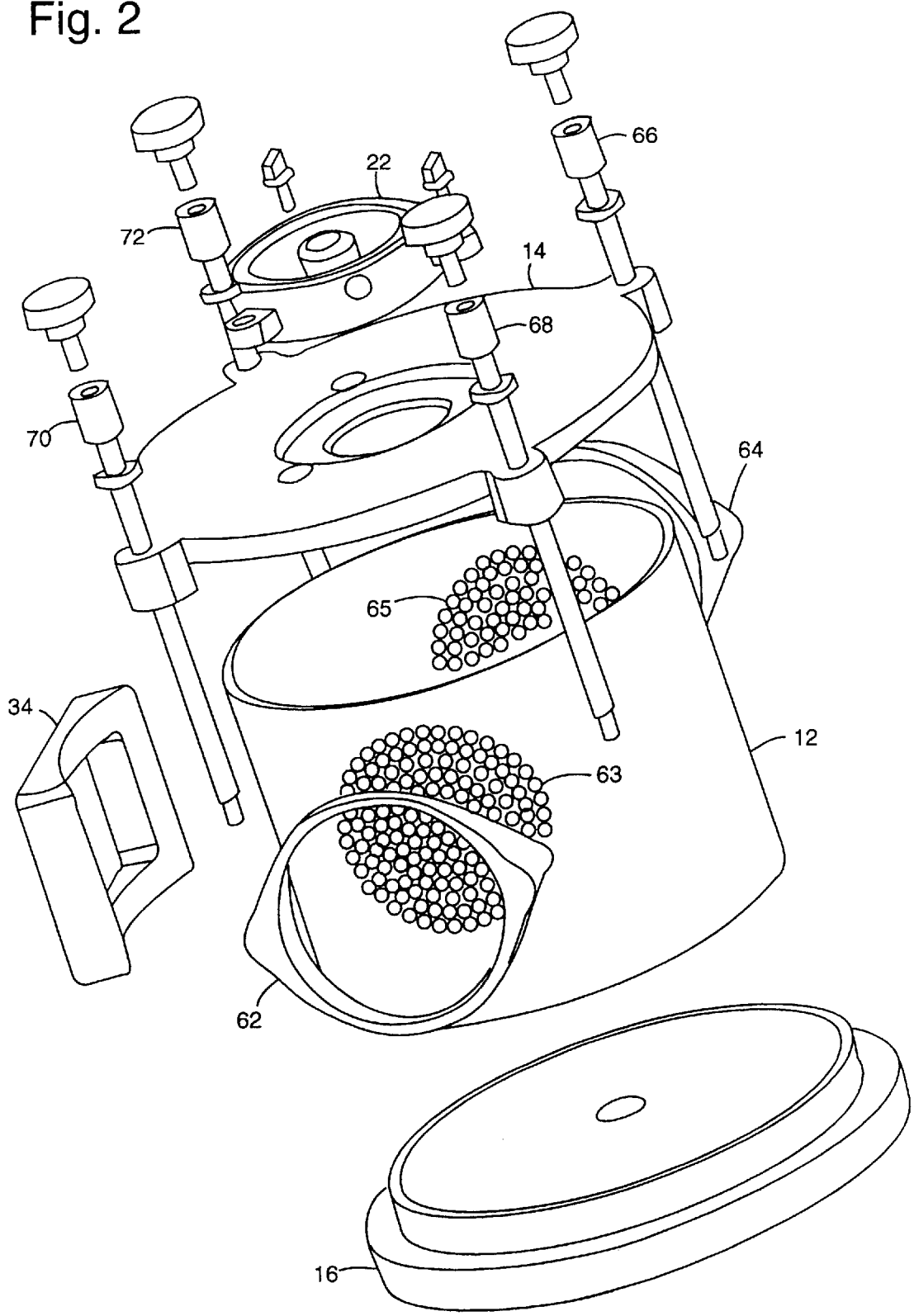
Figure 3:
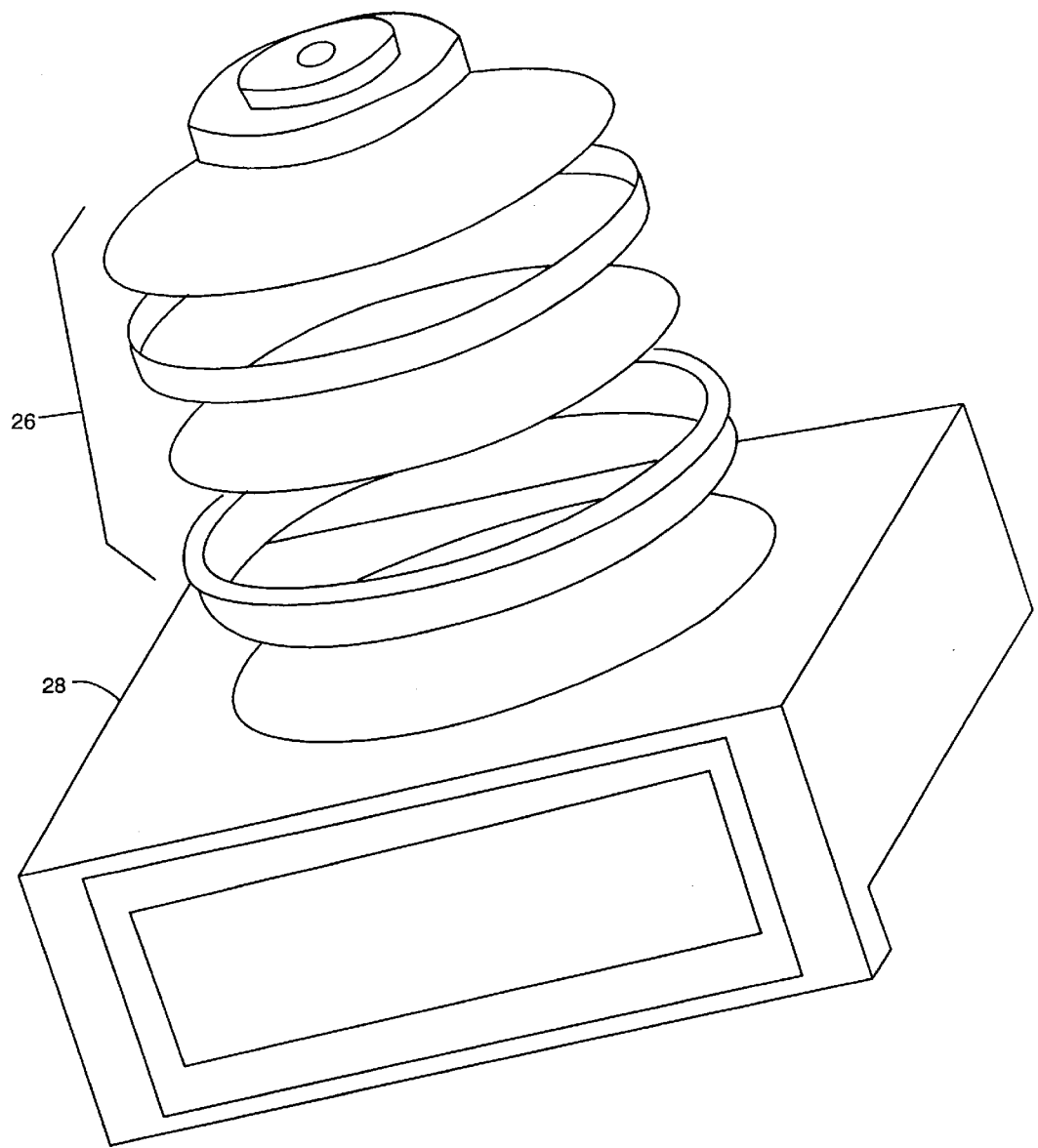

FIG. 1 is a cross sectional diagram of a microwave energy plasma source embodiment of the present invention mounted to a short coupled path extender and a semiconductor vacuum processing chamber;

FIGS. 2 and 3 taken together are an exploded assembly view of the microwave energy plasma source embodiment of the present invention of FIG. 1 which omit the microwave input waveguide and plasma tube, but show details of the short coupled path extender and the push-pull fan mountings and ventilation.

DETAILED DESCRIPTION OF THE PREFERRED EMBODIMENTS

FIG. 1 illustrates a microwave energy plasma source embodiment of the present invention, referred to herein by the general reference numeral 10. The microwave energy plasma source 10 comprises a metal cylinder 12 that has a top 14 and sits on a base 16. Such forms the basic microwave containment called a microwave cavity and the internal dimensions are preferably adjusted to resonance with the incoming microwave power. Typical systems use microwave energy centered on 2.45 GHz, which has a free-space wavelength of about 4.8". In alternative embodiments, the cylinder 12 includes a movable ceiling 18 and a movable floor 20 that are adjusted as tuning plates to fine tune the resonance of the cavity and thus the terminating impedance presented to the external microwave power source. A gas cap 22 allows a gas supply to be coupled into a plasma tube 24 made of quartz, sapphire, or ceramic. Which material is best is a function of the plasma source gas being used. Oxygen is a common plasma source gas used for etching. A short coupled path extender (SCPE) 26 connects the plasma produced into a semiconductor vacuum processing chamber. The SCPE 26 is preferably configured according to that described in U.S. patent application Ser. No. 08/788,602, filed Jan. 23, 1997. Such patent application is incorporated herein by reference. A wafer 30 being processed is shown inside the chamber 28 as an example of the use of the microwave energy plasma source 10.

Microwave energy from an external source is conventionally coupled in by a waveguide 32 that bolts to an adapter 34. Inside the cavity a microwave applicator 36 couples the received microwave energy to the plasma tube 24. A descriptive background on such applicators is provided by Carl F. Weissfloch, et al., describe one such applicator in U.S. Pat. No. 3,814,983, issued Jun. 4, 1974. Such patent is incorporated herein by reference. A tapered waveguide 38 is connected to a circular cage structure that surrounds the plasma tube 24. Such structure has four coaxial rings centered along the axis of the plasma tube 24. Plasma tubes with diameters of 1"–4" are typically accommodated.

A top shorting ring 40 and a bottom shorting ring 42 are parallel to one another. In alternative embodiments in may be advantageous to have the distance between rings 40 and 42 adjustable. A pair of feed rings 44 and 46 are located in between and receive opposite phases of microwave energy from the tapered waveguide 38. A set of six rods 51–56 are equally distributed at 60° intervals in a circle and connect at opposite ends to the top shorting ring 40 and the bottom shorting ring 42. The circumferential distance between adjacent rods 51–56 is critically required to be a distance about equal to about half of the wavelength of the incoming microwave energy. For example, at 2.45 GHz, such interval would be about 2.4". Since there are six rods 51–56 set at half wavelength intervals, the circuit around each feed ring is three whole wavelengths. The first rod, rod 51, is critically positioned at a location that is bisected by the longitudinal centerline of the tapered waveguide 38. Rods 51, 53, and 55 connect to the upper feed ring 44. Rods 52, 54, and 56 connect to the lower feed ring 46.

During operation, a gas 58 is heated into a plasma 60 by the coupling of microwave energy into the gas from the waveguide 32 by the applicator 36. Operating power levels of three thousand watts have been realized for relatively long durations and without damage.

FIGS. 2 and 3 help illustrate how the system is cooled. A fan is preferably mounted to an adapter boss 62 which is welded to the cylinder 12 around a group of ventilation holes 63. Air is either pumped in or drawn out. Another fan is preferably mounted to an adapter boss 64 which is welded to the cylinder 12 on the opposite side and around a group of ventilation holes 65. Cooling air is either pumped in or drawn out to combine with the other fan in a push-pull configuration. A set of bolts 66, 68, 70 and 72 hold down the lid 14 and attach the rest of the plasma source 10 securely to the wafer processing chamber 28. Preferably, such attachment allows for the interchangeable replacement and/or substitution of other plasma sources and processing modules on the wafer processing chamber 28.

Although the present invention has been described in terms of the presently preferred embodiment, it is to be understood that the disclosure is not to be interpreted as limiting. Various alterations and modifications will no doubt become apparent to those skilled in the art after having read the above disclosure. Accordingly, it is intended that the appended claims be interpreted as covering all alterations and modifications as fall within the true spirit and scope of the invention.

What is claimed is:

1. A modular wafer processing microwave energy plasma source, comprising:

a metal cylinder with top and bottom open ends fitted to a top lid and a bottom cover each with a centrally located port hole;

a plasma tube disposed along the central axis of the cylinder with a gas inlet disposed in said port hole in the top lid and a plasma outlet disposed in the port hole in the bottom cover;

a pair of fan mounts on opposite exterior sides of the cylinder that provide for a pair of push-pull air fans to move an air flow into and out of the interior of the cylinder to cool the plasma tube; and an access and mount located in the cylinder wall for a microwave energy applicator with a ring type slow wave structure to surround the plasma tube.

2. The plasma source of claim 1, further comprising:

a coupler to a semiconductor wafer process vacuum chamber attached to said bottom cover and connected to supply said plasma from said plasma outlet of the plasma tube to process a semiconductor wafer in said process chamber.

3. The plasma source of claim 1, further comprising:

a movable planar floor and ceiling tuning plate respectively disposed in the cylinder near said bottom cover and said top lid and between which is thus formed a tunable microwave cavity.

4. The plasma source of claim 1, wherein:

the top and bottom tuning plates are provided with adjustment means such that a microwave source impedance can be optimally matched to a terminating impedance of said microwave applicator by affecting the resonant frequency of the whole.

5. The plasma source of claim 1, wherein:

the plasma tube is constructed of quartz, sapphire, or ceramic according to the type of gas to be introduced into the plasma tube and converted into a gas plasma by microwave energy coupled in from a microwave energy source to said microwave energy applicator.

6. A modular wafer processing microwave energy plasma source, comprising:

a metal cylinder with top and bottom open ends fitted to a top lid and a bottom cover each with a centrally located port hole;

a plasma tube disposed along the central axis of the cylinder with a gas inlet disposed in said port hole in the top lid and a plasma outlet disposed in the port hole in the bottom cover;

a pair of fan mounts on opposite exterior sides of the cylinder that provide for a pair of push-pull air fans to move an air flow into and out of the interior of the cylinder to cool the plasma tube; and an access and mount located in the cylinder wall for a microwave energy applicator with a ring type slow wave structure to surround the plasma tube;

wherein, said microwave applicator provides for generating gas plasmas from microwave energy and comprises:
- a set of six equal-length parallel rods equally distributed at regular angular intervals of 60° in a circle;
- a top planar shorting ring perpendicularly connected to a top end of each and every one of the rods;
- a bottom planar shorting ring perpendicularly connected to a bottom end of each and every one of the rods;
- an upper and a lower planar feed ring that are each parallel to and positioned between the top and bottom planar shorting rings;
- telescoping means included in each of the rods that provides for adjusting the electrical distance between the top and bottom planar shorting rings and that provides for matching a resonant frequency of the applicator to an operating frequency of said microwave power source such that any impedance mismatch reflections can be minimized and any energy transferred to a plasma generated within said gas plasma tube can be maximized; and
- a tapered waveguide connected to feed opposite phases of microwave energy from said microwave power source to the upper and lower feed rings at a radial position intersected by any one of the rods;

wherein, the planar shorting rings and planar feed rings are each provided with a coaxial hole to accommodate a gas plasma tube;

wherein, the upper planar feed ring connects to odd numbered rods and the lower planar feed ring connects to even numbered rods; and wherein, the equal-length parallel rods are positioned such that adjacent rods are separated by about one half of the wavelength of operation of a microwave power source.

* * * * *